United States Patent
Wieduwilt et al.

(10) Patent No.: US 11,244,741 B1
(45) Date of Patent: Feb. 8, 2022

(54) SELECTABLE FUSE SETS, AND RELATED METHODS, DEVICES, AND SYSTEMS

(71) Applicant: Micron Technology, Inc., Boise, ID (US)

(72) Inventors: Christopher G. Wieduwilt, Boise, ID (US); James S. Rehmeyer, Boise, ID (US); Seth A. Eichmeyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/089,002

(22) Filed: Nov. 4, 2020

(51) Int. Cl.
*G11C 29/00* (2006.01)
*G11C 11/40* (2006.01)
*G11C 11/408* (2006.01)

(52) U.S. Cl.
CPC .......... *G11C 29/70* (2013.01); *G11C 11/4082* (2013.01)

(58) Field of Classification Search
CPC .............................. G11C 29/70; G11C 11/4082
See application file for complete search history.

(56) References Cited

U.S. PATENT DOCUMENTS

| | | | | |
|---|---|---|---|---|
| 7,120,068 B2* | 10/2006 | Lakhani | ................ | G11C 29/76 365/200 |
| 7,401,270 B2* | 7/2008 | Hummler | ............... | G11C 29/44 714/710 |
| 7,701,226 B2* | 4/2010 | Kaneko | ................. | G01R 31/74 324/550 |
| 8,194,489 B2* | 6/2012 | Bentley | ................. | G11C 17/18 365/225.7 |
| 8,467,260 B2* | 6/2013 | Gorman | ................ | G11C 17/16 365/225.7 |
| 9,064,587 B2* | 6/2015 | Blodgett | ............... | G11C 17/16 |
| 9,514,859 B1* | 12/2016 | Scarpa | .................. | H01B 7/292 |
| 9,589,675 B2* | 3/2017 | Kim | ....................... | G11C 29/76 |
| 10,056,154 B2* | 8/2018 | Fujiwara | ............... | G11C 17/18 |
| 10,600,496 B1 | 3/2020 | Wieduwilt et al. | | |
| 2013/0159799 A1* | 6/2013 | Brown | .......... | G01R 31/318566 714/726 |

OTHER PUBLICATIONS

Wieduwilt et al., U.S. Appl. No. 16/693,126 titled Memory Device with a Memory Repair Mechanism and Methods for Operating the Same, filed Nov. 22, 2019.
Wieduwilt et al., U.S. Appl. No. 16/983,757 titled Memory Devices with Redundant Memory Cells for Replacing defective Memory Cells, and Related Systems, filed Aug. 3, 2020.

* cited by examiner

*Primary Examiner* — Tri M Hoang
(74) *Attorney, Agent, or Firm* — TraskBritt (57) ABSTRACT

Memory devices are disclosed. A memory device may include a number of memory banks and a number of latch sets, wherein each latch set is associated with a memory bank. The device may also include a fuse array including a number of fuses. The device may further include circuitry configured to read data from a first set of fuses of the number of fuses and broadcast data from the first set of fuses to a first latch set of the number of latch sets. Further, in response to a repair result associated with the first set of fuses being a first state, the circuitry may be configured to read a second set of fuses and broadcast the second set of fuses to the first latch set. Methods of operating a memory device, and electronic systems are also disclosed.

20 Claims, 8 Drawing Sheets

SELECTABLE FUSE SETS, AND RELATED METHODS, DEVICES, AND SYSTEMS

TECHNICAL FIELD

Embodiments of the disclosure relate generally to selectable fuse sets. More specifically, various embodiments relate to memory devices including a number of fuse sets of a fuse array that may selectively broadcast to a latch set, and to related methods, devices, and systems.

BACKGROUND

Memory devices are typically provided as internal, semiconductor, integrated circuits in computers or other electronic systems. There are many different types of memory including, for example, random-access memory (RAM), read only memory (ROM), dynamic random access memory (DRAM), synchronous dynamic random access memory (SDRAM), resistive random access memory (RRAM), magnetic random access memory (MRAM), ferroelectric random access memory (FeRAM), double data rate memory (DDR), low power double data rate memory (LPDDR), phase change memory (PCM), and Flash memory.

Memory devices include many memory cells that are configured to hold a charge or other physical state that is representative of a bit of data. Typically, these memory cells are arranged in a memory array. Data may be written to or retrieved from a memory cell by selectively activating the memory cell via an associated word line driver.

DETAILED DESCRIPTION

A semiconductor memory device typically includes an array of memory cells. Memory cells in the array are selected for reading and writing by means of row and column address signals input to the memory device. The row and column address signals are processed by address decoding circuitry to select row lines and column lines in the array to access the desired memory cell or memory cells.

When semiconductor devices are manufactured, defective memory cells may occur in the memory array or in a sub-array. To salvage the semiconductor memory device despite these defective memory cells, and thus to increase overall yield in the manufacturing process, redundancy is commonly implemented. Redundant memory cells are located in the memory array and the memory array may be associated with a number of redundant memory cells. When a defective memory cell is detected in the memory array (e.g., during a probe test or a burn test), redundant decoding circuitry associated with the redundant memory cells may be programmed (e.g., via fuse, antifuse, or other programming techniques) to respond to the address of the defective memory cell. When the address of the defective memory cell is selected for access, the redundant memory cell may be accessed (e.g., read from or written to) rather than the defective memory cell.

As will be appreciated by a person having ordinary skill in the art, if a repair (e.g., a column repair or a row repair) is performed in response to a probe test (i.e., a defective element is replaced by a redundant element), and subsequently, the redundant element is determined to be defective (e.g., at burn), it may be required to cancel the repair. A canceled repair (e.g., a canceled column repair) includes disabling the repair (e.g., in response to a fuse blow issue or redundant element defect) and performing a second repair pointing to the same array address. In other words, for example, a column repair may be canceled when a repair element blown in response to a probe test was subsequently found to be defective (e.g., at a burn test) (i.e., an initial column repair is disabled and a new column repair is used to repair the original defect).

In some conventional repair schemes, each local latch set is hard-tied to a single fuse set, and local latch sets can only be used once. Further, in some conventional repair schemes, a canceled column repair may render a local latch set unusable, even though the local latch set may not be defective. In other words, although a local latch may be operable (i.e., in good condition), the local latch may be unusable if an array element that the local latch points to is defective. Further, some conventional repair schemes may be limited by local latches, and in these schemes especially, a defective array element or bad fuse blow may disproportionately impact a memory device (i.e., compared to other repair schemes that are not local fuse latch limited).

According to various embodiments as described more fully below, a number of local latch sets of a memory device (e.g., each local latch set of a memory device), may be associated with a number of (e.g., two or more) fuse sets of a fuse array. More specifically, for example, each local latch set may be associated with two fuse sets (e.g., a primary fuse set and a backup fuse set). In other words, a device (e.g., a memory device) may include at least two fuse sets for each local latch set. Further, according to various embodiments, one of a number of (e.g., two or more) fuse sets may selectively broadcast to a local latch set. More specifically, for example, in one scenario wherein a primary fuse set is enabled and a backup fuse set is disabled, the primary fuse set may broadcast to a local latch set, and in another scenario wherein the primary fuse set is disabled and the backup fuse set is enabled, the backup fuse set may broadcast to the local latch set.

As will be appreciated in view of the various embodiments disclosed herein, compared to conventional devices, systems, and methods, a canceled repair (e.g., a canceled column repair), or a defective fuse blow, may not waste a local latch set. Rather, according to various embodiments, a local latch set, which is used in a canceled repair (e.g., a column repair or a row repair), may be used for another repair (e.g., a new, non-defective repair).

Although various embodiments are described herein with reference to memory devices, the present disclosure is not so limited, and the embodiments may be generally applicable to microelectronic devices that may or may not include semiconductor devices and/or memory devices. Further, although various embodiments are described with reference to column repair schemes, embodiments of the present disclosure may be also be applicable to row repair schemes. Embodiments of the present disclosure will now be explained with reference to the accompanying drawings.

Figure 1:
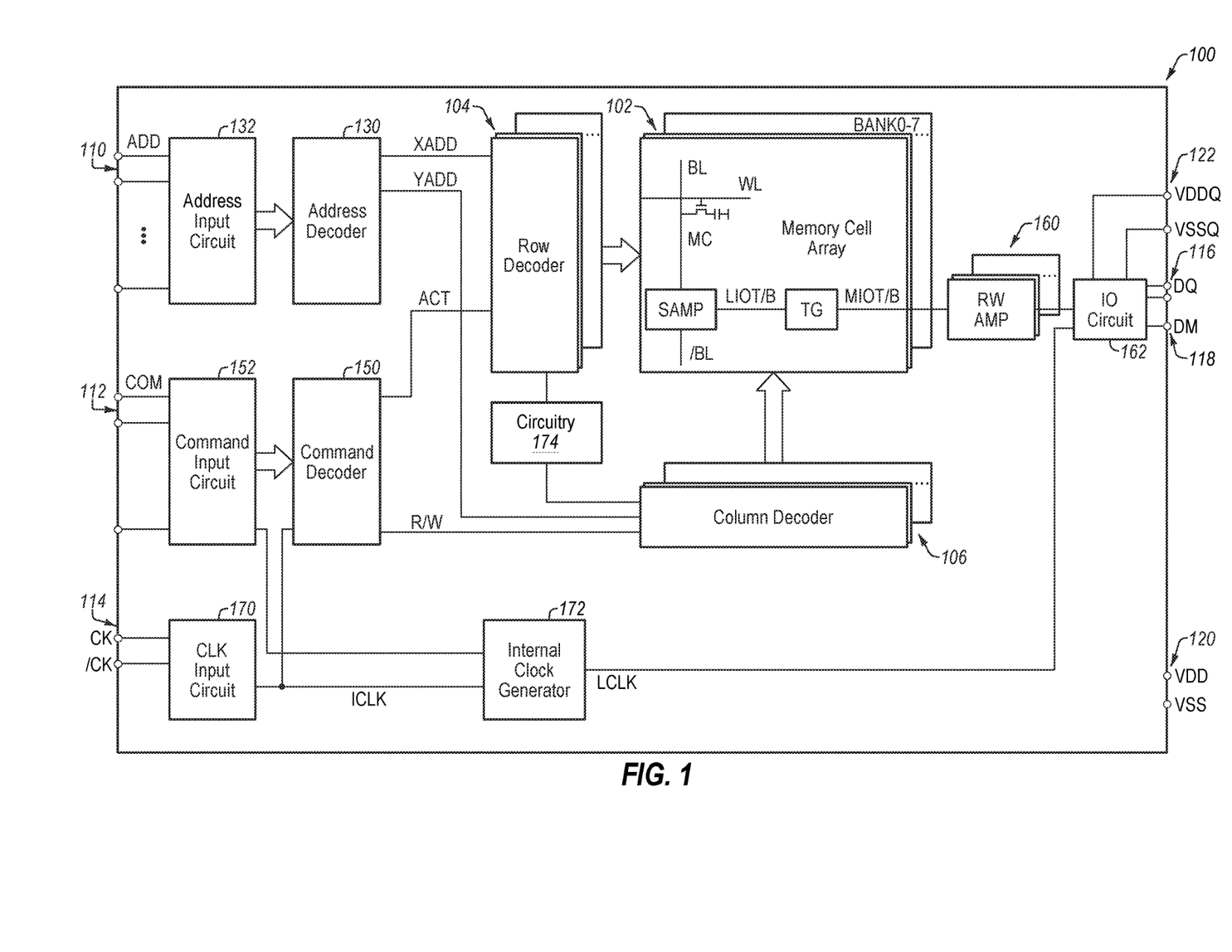
FIG. 1 is a block diagram of an example memory device, in accordance with at least one embodiment of the present disclosure.

FIG. 1 is a functional block diagram illustrating an example memory device 100, in accordance with at least one embodiment of the present disclosure. Memory device 100 may include, for example, a DRAM (dynamic random access memory), a SRAM (static random access memory), a SDRAM (synchronous dynamic random access memory), a DDR SDRAM (double data rate SDRAM, such as a DDR4 SDRAM and the like), or a SGRAM (synchronous graphics random access memory). Memory device 100, which may be integrated on a semiconductor chip, may include a memory array 102.

In the embodiment of FIG. 1, memory array 102 is shown as including eight memory banks BANK0-7. More or fewer banks may be included in memory array 102 of other embodiments. Each memory bank includes a number of access lines (word lines WL), a number of data lines (bit lines BL and/BL), and a number of memory cells MC arranged at intersections of the number of word lines WL and the number of bit lines BL and/BL. The selection of a word line WL may be performed by a row decoder 104 and the selection of the bit lines BL and/BL may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and/BL are coupled to a respective sense amplifier SAMP. Read data from bit line BL or/BL may be amplified by sense amplifier SAMP, and transferred to read/write amplifiers 160 over complementary local data lines (LIOT/B), a transfer gate (TG), and complementary main data lines (MIOT/B). Conversely, write data outputted from read/write amplifiers 160 may be transferred to sense amplifier SAMP over complementary main data lines MIOT/B, transfer gate TG, and complementary local data lines LIOT/B, and written in memory cell MC coupled to bit line BL or/BL.

Memory device 100 may be generally configured to receive various inputs (e.g., from an external controller) via various terminals, such as address terminals 110, command terminals 112, clock terminals 114, data terminals 116, and data mask terminals 118. Memory device 100 may include additional terminals such as a power supply terminal 120 and a power supply terminal 122.

During a contemplated operation, one or more command signals COM, received via command terminals 112, may be conveyed to a command decoder 150 via a command input circuit 152. Command decoder 150 may include a circuit configured to generate various internal commands via decoding the one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Although command input circuit 152 and address input circuit 132 are illustrated as separate circuits, in some embodiments, address signals and command signals may be received via a common circuit.

Active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to the read/write signal R/W, column decoder 106 may be activated, and the bit line BL specified by the column address YADD may be selected.

In response to active command ACT, a read signal, a row address XADD, and a column address YADD, data may be read from the memory cell MC specified by the row address XADD and the column address YADD. The read data may be output via sense amplifier SAMP, transfer gate TG, read/write amplifiers 160, an input/output circuit 162, and data terminals 116. Further, in response to active command ACT, a write signal, a row address XADD, and a column address YADD, write data may be supplied to memory array 102 via data terminals 116, input/output circuit 162, read/write amplifiers 160, transfer gate TG, and sense amplifier SAMP. The write data may be written to the memory cell MC specified by the row address XADD and the column address YADD.

Clock signals CK and /CK may be received via clock terminals 114. A clock input circuit 170 may generate internal clock signals ICLK based on the clock signals CK and /CK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of the input/output circuit 162). Further, data mask terminals 118 may receive one or more data mask signals DM. When data mask signal DM is activated, overwrite of corresponding data may be prohibited.

In some embodiments, memory device 100 may also include circuitry 174, which, in some embodiments, may be coupled to one or more address decoders, such as address decoder 130, row decoder 104, and/or column decoder 106. In some embodiments, circuitry 174, or parts thereof, may be included in one or more of address decoder 130, row decoder 104 and/or column decoder 106. Additionally or alternatively, address decoder 130, row decoder 104 and/or column decoder 106 may be configured to perform one or more operations described with regard to circuitry 174. Additionally or alternatively, address input circuit 132 may include one or more elements of circuitry 174 and/or may be configured to perform one or more operations described with regard to circuitry 174.

Circuitry 174 may be configured to repair defective memory cells of memory array 102. For example, circuitry 174 may be configured to replace a defective memory cell of memory array 102 with a redundant memory cell of memory array 102. More specifically, circuitry 174 may be configured to cause the redundant memory cell to be accessed in response to an operation that includes an address of the defective memory cell (i.e., instead of the defective memory cell). In the present disclosure, the term "repair" may refer to causing a redundant memory cell (or a group of redundant memory cells) to be accessed instead of a defective memory cell (or a group of memory cells including one or more defective memory cells).

Circuitry 174 may include fuses, anti-fuses, and/or latch circuits configured to store replacement information (e.g., locations of defective memory cells, locations of redundant memory cells, and/or associations between redundant memory cells and defective memory cells). In some embodiments, memory device 100 may include fuses in one location of memory device 100 and may include one or more latch circuits located in other locations of memory device 100. The latch circuits may include latches configured to latch states of the fuses. In the present disclosure, the term "latch" may be used to refer to a latch circuit.

Circuitry 174 may be configured to determine whether an operation address (e.g., a row address XADD and/or a column address YADD) associated with a command (e.g., ACT and/or R/W) addresses a defective memory cell for which a repair (e.g., a redundant memory cell) has been identified. Circuitry 174 may be configured to cause memory device 100 (e.g., through row decoder 104 and/or column decoder 106) to access the redundant memory cell rather than the defective memory cell.

Figure 2:
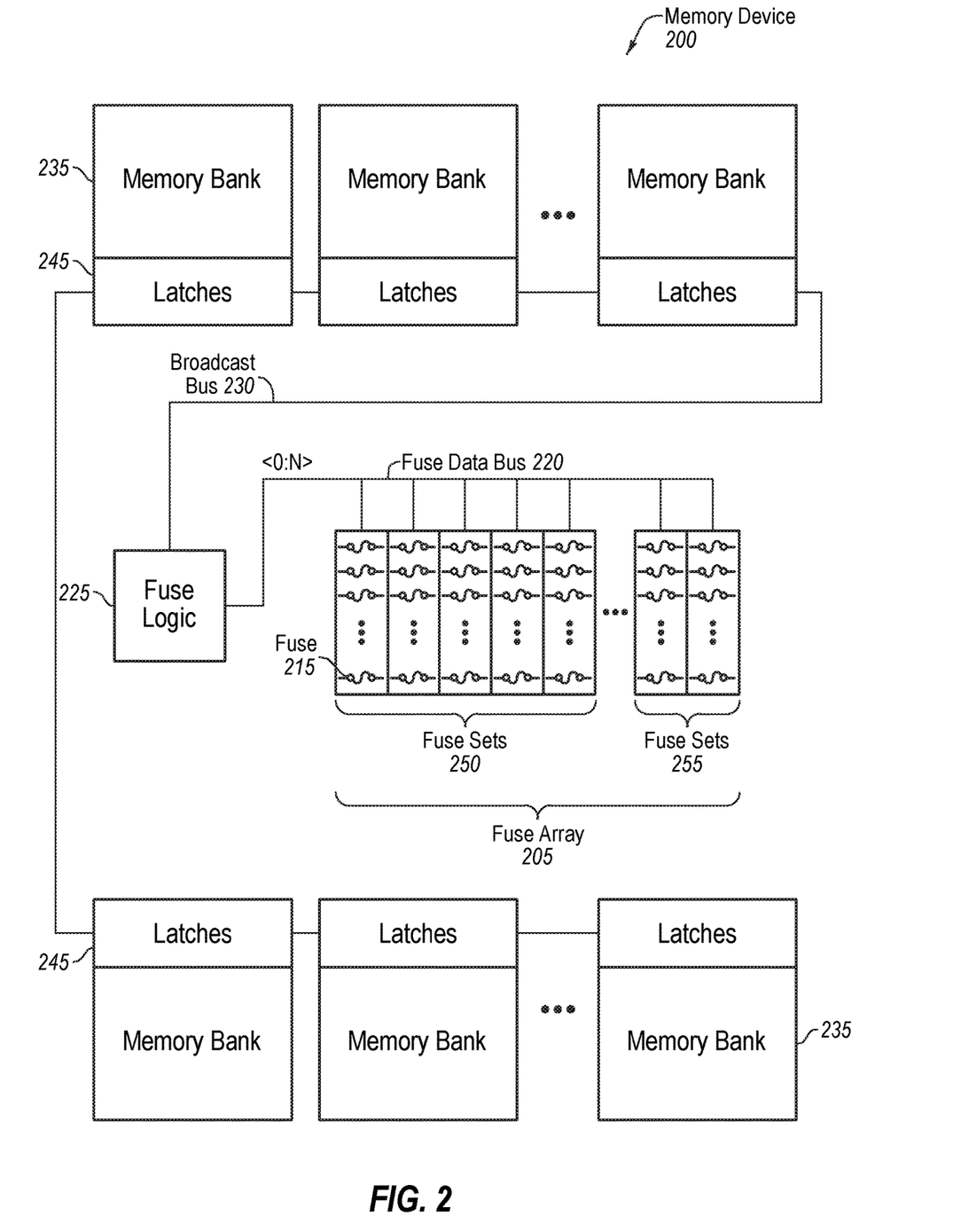
FIG. 2 depicts a portion of an example memory device including a number of memory banks and a fuse array, according to various embodiments of the present disclosure.

FIG. 2 illustrates a portion of an example memory device 200 including a number of memory banks and a fuse array, according to various embodiments of the present disclosure in accordance with various aspects of the present disclosure. Memory device 200 may include a fuse array 205, a fuse data bus 220, a fuse logic component 225, a broadcast bus 230, memory banks 235, and latches 245. For example, fuse array 205, fuse data bus 220, fuse logic component 225, broadcast bus 230, and/or latches 245 may be part of, or may be coupled to, circuitry 174 of FIG. 1.

Fuse array 205 may be configured to store operating information for memory device 200. In some cases, the operating information may include information for adjusting operating parameters of memory device 200. For example, fuse array 205 may include repair information which may be used to indicate that particular rows, columns, or plate lines are defective or associated with defective memory cells. In some cases, fuse array 205 is centrally located relative to memory banks 235 in memory device 200.

In some cases, fuse array 205 may be partitioned into multiple fuse sets, including fuse sets 250 and backup fuse sets 255. According to some embodiments, each fuse set 250 includes an associated backup fuse set 255. In some examples, each fuse set may include the same number of fuses, which may be represented by N. For instance, each fuse set may include a sufficient number of fuses to support the largest type of data (e.g., if a row address is 15 bits, a column address is 6 bits, and a plate address is 13 bits, then each fuse set in fuse array 205 may include at least 15 fuses).

Fuse sets of fuse array 205 may include multiple fuses, including fuses 215. Each fuse 215 may be configured to store one bit of data (e.g., fuse 215 may store one bit of a 15-bit column address). In some cases, fuse 215 may be temporarily or permanently programmed to have a high resistance or low resistance, which may correspond to a logic 0 and a logic 1, respectively or vice versa. In some cases, fuse 215 is permanently programmed to have a high resistance by melting a conductive material in fuse 215 until current can no longer flow through fuse 215.

Fuse data bus 220 may be configured to uni-directionally or bi-directionally communicate the operating information to and from fuse array 205. In some cases, fuse data bus 220 is configured to support parallel signaling of the information bits stored in all of the fuses of a single fuse set and serial signaling of the data stored in each fuse set (e.g., fuse data bus 220 may concurrently signal 16 bits of information from one fuse set, concurrently signal 16 bits of information from another fuse set, and so on). To support parallel signaling of all of the information bits stored in a fuse set, a size of fuse data bus 220 may be configured to be large enough to support the largest type of data to be stored in fuse array 205. Additionally or alternatively, a size of fuse data bus 220 may be configured to be at least as large as the fuse sets in fuse array 205. In some cases, fuse data bus 220 includes multiple conductive traces, which may be represented by the number N (e.g., if each fuse set 250/255 includes 16 fuses, then fuse data bus 220 may include 16 conductive traces). Fuse data bus 220 may communicate the information stored in fuse array 205 to fuse logic component 225.

Fuse logic component 225 may be configured to process and distribute the information stored in fuse array 205 to the appropriate locations throughout memory device 200. For example, fuse logic component 225 may access and transmit data stored in particular fuse sets to particular latches throughout memory device 200. Fuse logic component 225 may ensure that the proper information is sent to the proper latches and/or memory bank by transmitting an activation signal (or "token") that is passed throughout memory device 200 and a series of pulses that indicate when to latch data. Broadcast bus 230 may be configured to deliver fuse data to particular latches located throughout memory device 200, along with signaling (e.g., an activation signal and clock signal) to ensure that the proper fuse data is stored in the proper latch locations. In some cases, the process of distributing the data stored in the fuse sets of fuse array 205 throughout memory device 200 may be referred to as "broadcasting."

In some cases, memory banks 235 of memory device 200 are grouped into memory bank groups. Each memory bank group may include a subset of the memory banks included in memory device 200. Each memory bank 235 may be configured to store electronic data (e.g., user data), and each memory bank may include multiple memory cells which may be arranged in rows and columns. The memory cells in memory bank 235 may also be coupled with and accessible via row lines, column lines, and/or plate lines. In some cases, certain memory cells, row lines, column lines, and/or plate lines may be identified as being corrupted or defective (e.g., due to manufacturing failures, overheating, and the like).

Latches 245, which may also be referred to herein as "local latches," may be configured to store information for operating an associated memory bank 235. In some cases, latches 245 may include repair latches, which may store memory addresses corresponding to defective memory elements identified in first memory bank 235 (e.g., defective row, column, plates or memory cells).

According to various embodiments, a number of (e.g., two or more) possible fuse sets of a fuse array (e.g., fuse array 205) may be configured for a column repair (e.g., for each column repair) (i.e., at least two sets of fuses may associated with (e.g., configured for coupling to) a single local latch set). More specifically, in at least some embodiments, a memory device may be configured such that either a first set of fuses (e.g., a fuse set of fuse sets 250) or a backup set of fuses (e.g., a fuse set of fuse sets 255) may be used for a column repair.

In some conventional systems, devices, and/or methods, a first set of fuses is read, data from the first set of fuses is broadcast to a first local latch set, and a fuse broadcast token is incremented. Subsequently, a second set of fuses is read, data from the second set of fuses is broadcast to a second local latch set, and a fuse broadcast token is incremented. This process may be repeated for a number (e.g., 64) of fuse sets of a memory device. In contrast, according to at least some embodiments of the present disclosure, a first fuse set (e.g., including N (e.g., 16) fuses) is read and data from the first fuse set is broadcast to a local latch set, and subsequently, a second fuse set (e.g., a backup fuse set) (e.g., including N (e.g., 16) fuses) may be read. However, in this contemplated example, data from the second fuse set may or may not be broadcast. According to some embodiments, as described more fully below, a repair state (e.g., an XOR Enable state (e.g., based on an Enable fuse and an XOR Enable Address or based on a decoded state of the first fuse set) of the first fuse set may be used to determine whether the second fuse set is broadcast. For example, if the repair state (e.g., the XOR Enable) associated with the read of the first fuse set is a first value (e.g., a "0") (e.g., neither an enable fuse nor an XOR enable fuse is blown or based on a decoded state of the first fuse set), a repair element was not used or the repair element was disabled. Thus, in this example (i.e., wherein the repair state is the first value), a fuse token (e.g., fuse broadcast token) is not incremented. Continuing with this example, the second fuse set is then read and the data from the second fuse is broadcast, and subsequently, the fuse token is incremented.

On the other hand, if the repair state (e.g., the XOR Enable) associated with the read of the first fuse set is a second value (e.g., a "1") (e.g., either an enable fuse or a XOR enable fuse is blown or based on a decoded state of the first fuse set), a repair element was used (i.e., and not disabled). Thus, in this example (i.e., wherein the repair state is the second value), a fuse token is not incremented. Continuing with this example, in some embodiments, the second fuse set is read, but the data from the second fuse is not broadcast, and subsequently, the fuse token is incremented. Further, in other embodiments (i.e., when the repair state is the second value), it may not be required to read the second fuse set (i.e., the backup fuse set).

Figure 3:
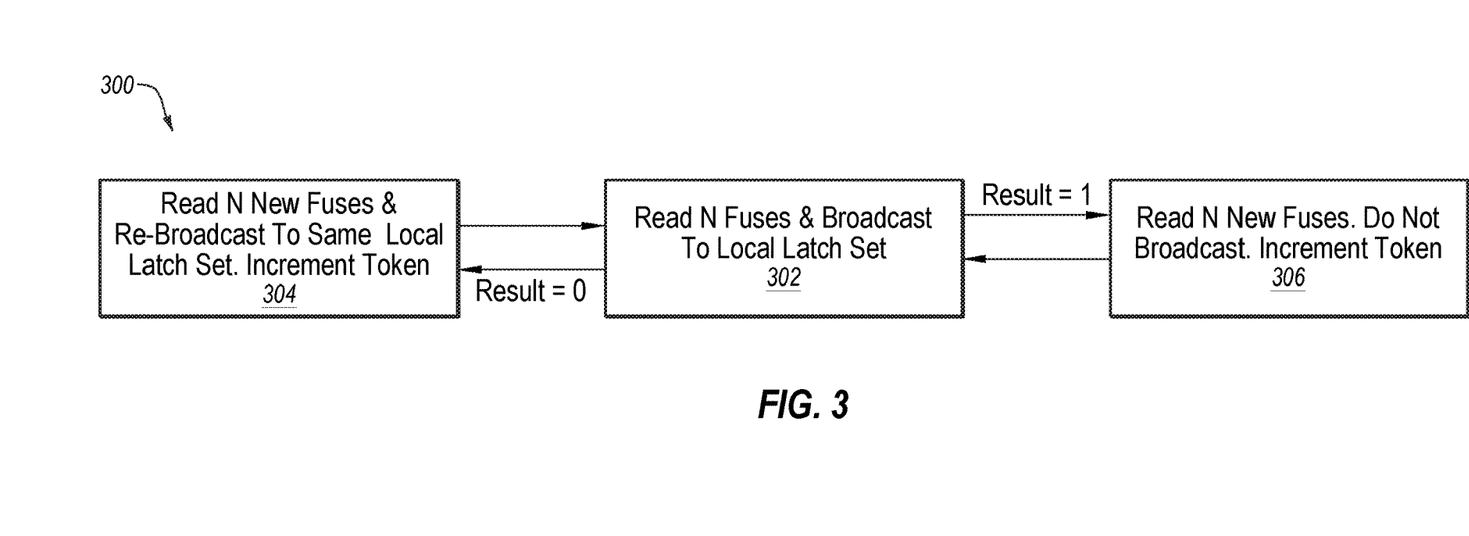
FIG. 3 is a flowchart of an example method of broadcasting fuse array sets to local latch sets, in accordance with various embodiments of the present disclosure.

FIG. 3 is a flowchart of an example method 300 of broadcasting fuse array sets to local latch sets, in accordance with various embodiments of the disclosure. Method 300 may be arranged in accordance with at least one embodiment described in the present disclosure. Method 300 may be performed, in some embodiments, by a device or system, such as memory device 100 of FIG. 1, memory device 200 of FIG. 2, a memory device 400 of FIG. 4, a memory system 700 of FIG. 7, and/or an electronic system 800 of FIG. 8, or another device or system. Although illustrated as discrete blocks, various blocks may be divided into additional blocks, combined into fewer blocks, or eliminated, depending on the desired implementation.

Method 300 may begin at block 302, where N (e.g., 16) fuses are read, and data from the read (i.e., the read at block 302) may be broadcast to a local latch set (a "first local latch set"). If a result of the read indicates that the first set of fuses is not associated with a repair or that the first set of fuses is associated with a canceled repair (i.e., Result=0), method 300 may proceed to block 304. Otherwise, if the result of the read indicates that the first set of fuses is associated with a repair (i.e., Result=1), method 300 may proceed to block 306. As described more fully below, in some embodiments, an XOR Enable state (i.e., associated with the first fuse read) being equal to a first value (e.g., Result=0) may indicate that a repair was not used or that a repair was canceled (i.e., disabled), and an XOR Enable (i.e., associated with the first fuse read) being equal to a second value (e.g., Result=1) may indicate that a repair was used.

At block 304, N (e.g., 16) new fuses are read, and data from the read (i.e., the read at block 304) may be broadcast to the same local latch set (i.e., the first local latch set), and a token (e.g., an increment fuse broadcast token) is incremented, and method 300 may return to block 302.

At block 306, N (e.g., 16) new fuses are read; however data from the read (i.e., the read at block 306) is not broadcast, and a token (e.g., an increment fuse broadcast token) is incremented, and method 300 may return to block 302. For example, the acts of method 300 may be repeated for a number of (e.g., 128) fuse sets of a memory device.

Modifications, additions, or omissions may be made to method 300 without departing from the scope of the present disclosure. For example, the operations of method 300 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

Figure 4:
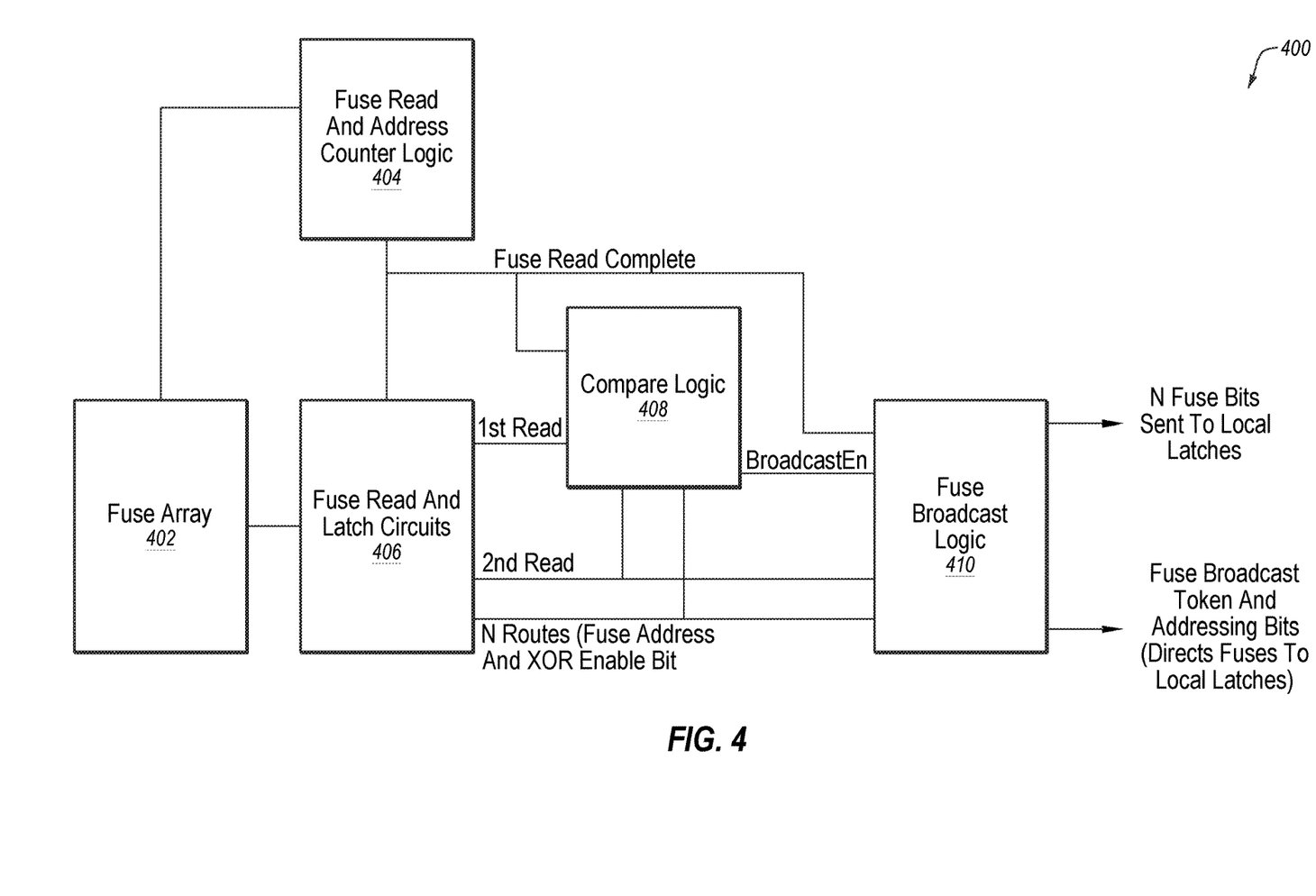
FIG. 4 is block diagram of a portion of an example memory device including a fuse array and associated circuitry and logic, according to various embodiments of the present disclosure.

FIG. 4 includes a block diagram of a portion of an example memory device 400 including a fuse array (e.g., "a redundant column fuse array") 402 and associated circuitry and logic, in accordance with various embodiments of the present disclosure. Memory device 400 includes fuse array 402 coupled to fuse read and address counter logic 404 and fuse read and latch circuits 406. Memory device 400 further includes compare logic 408, which may include, for example XOR compare logic. Memory device 400 also includes fuse broadcast logic 410. For example, fuse array 402, fuse read and address counter logic 404, fuse read and latch circuits 406, compare logic 408, and/or fuse broadcast logic 410 may be part of, or may be coupled to, circuitry 174 of FIG. 1.

Fuse read and latch circuits 406 may be configured to read a fuse set from fuse array 402. Further, fuse read and latch circuits 406 may also be configured to generate a signal Fuse Read Complete, which may be received by fuse read and address counter logic 404 and fuse broadcast logic 410. Fuse Read Complete signal may enable a new group of fuses to be read from fuse array 402. Further, in response to receipt of Fuse Read Complete signal, fuse read and address counter logic 404 may increment a fuse read address counter. Moreover, in some scenarios, in response to receipt of Fuse Read Complete signal, fuse broadcast logic 410 may increment a fuse broadcast token and broadcast fuse data (data read from a fuse set) to a local latch set.

Compare logic 408 may be configured to receive Fuse Read Complete signal, data from a fuse set (e.g., "$1^{st}$ Read" or "$2^{nd}$ Read"), and fuse address and XOR enable bit information. Compare logic 408 may be configured to determine a repair state (also referred to herein as a "repair enable state"). More specifically, for example, compare logic 408 may be configured to determine an XOR Enable state associated with a fuse set (e.g., based on an Enable fuse and a XOR Enable fuse of the fuse set or based on a decoded state of the fuse set). Compare logic 408 may also be configured to generate a broadcast enable signal Broadcast En, which may be received by fuse broadcast logic 410.

According to various embodiments of the present disclosure, broadcast enable signal Broadcast En is asserted on a first read (i.e., of a first set of fuses). Further, broadcast enable signal Broadcast En is asserted on a second read (i.e., of a second set of fuses) responsive to a result of the first read indicating that the first set of fuses is not associated with a repair or that the first set of fuses is associated with a canceled repair (e.g., a repair enable state (e.g., XOR Enable) is a logic 0). Moreover, broadcast enable signal Broadcast En is negated on the second read (i.e., of the second set of fuses) responsive to a result of the first read indicating that the first set of fuses is associated with a repair (e.g., repair enable state (e.g., XOR Enable) is a logic 1).

Fuse broadcast logic 410 may broadcast fuse data (i.e., fuse bits) to a local latch set if broadcast enable signal Broadcast En is asserted, and fuse broadcast logic 410 may not broadcast fuse data (i.e., fuse bits) to the local latch set if broadcast enable signal Broadcast En is negated. Further, fuse broadcast logic 410 may be configured to increment the fuse broadcast token (and addressing bits) after broadcasting fuse data from the second read (e.g., in block 304 of FIG. 3) or after the second read (e.g., in block 306 of FIG. 3).

Figure 5:
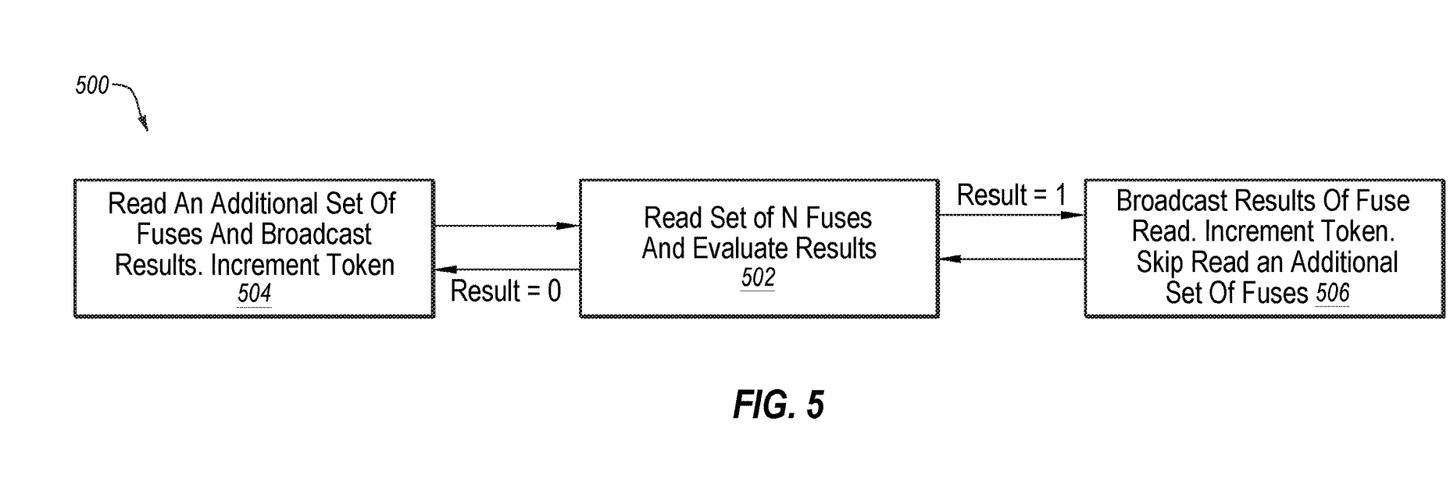
FIG. 5 is a flowchart of another example method of broadcasting fuse array sets to local latch sets, in accordance with various embodiments of the present disclosure.

FIG. 5 is a flowchart of another example method 500 of broadcasting fuse array sets to local latch sets, in accordance with various embodiments of the disclosure. Method 500 may be arranged in accordance with at least one embodiment described in the present disclosure. Method 500 may be performed, in some embodiments, by a device or system, such as memory device 100 of FIG. 1, memory device 200 of FIG. 2, memory device 400 of FIG. 4, a memory system 700 of FIG. 7, and/or an electronic system 800 of FIG. 8, or another device or system. Although illustrated as discrete blocks, various blocks may be divided into additional blocks, combined into fewer blocks, or eliminated, depending on the desired implementation.

Method 500 may begin at block 502, where a set of N (e.g., 16) fuses is read. If a result of the read indicates that the set of N fuses is not associated with a repair or that the set of N fuses is associated with a canceled repair (i.e., Result=0), method 500 may proceed to block 504. Otherwise, if the result of the read indicates that the set of N fuses is associated with a repair (i.e., Result=1), method 500 may proceed to block 506. As described above, in some embodiments, an XOR Enable bit of the set of N fuses being equal to a first value (e.g., "0") may indicate that a repair was not used or that a repair was canceled (i.e., disabled), and the XOR Enable bit of the set of N fuses being equal to a second value (e.g., "1") may indicate that a repair was used.

At block 504, another set of N (e.g., 16) fuses is read, and data from the read (i.e., the read at block 504) is broadcast to a local latch set, and a token (e.g., an increment fuse broadcast token) is incremented, and method 500 may proceed to return to block 502.

At block 506, data from the read performed at block 502 is broadcast to a local latch set, and a token (e.g., an increment fuse broadcast token) is incremented, and method 500 may proceed to return to block 502. It is noted that a set of fuses (e.g., a backup set of fuses) is not read at block 506. For example, the acts of method 500 may be repeated for a number of (e.g., 128) fuse sets of a fuse array of a memory device.

Modifications, additions, or omissions may be made to method 500 without departing from the scope of the present disclosure. For example, the operations of method 500 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

Figure 6:
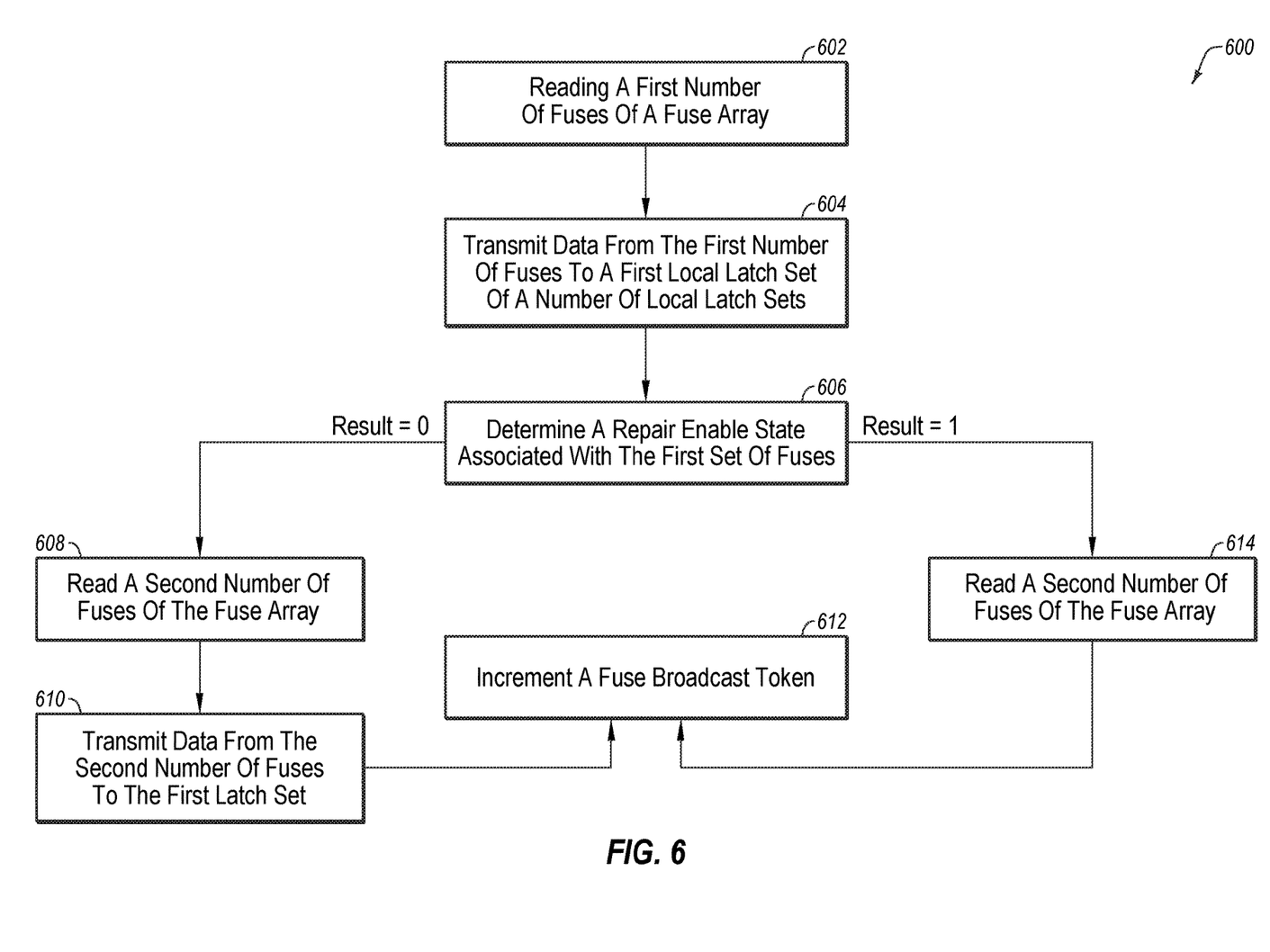
FIG. 6 is a flowchart of an example method of operating a memory device, in accordance with various embodiments of the present disclosure.

FIG. 6 is a flowchart of an example method 600 of operating a memory device, in accordance with various embodiments of the disclosure. Method 600 may be arranged in accordance with at least one embodiment described in the present disclosure. Method 600 may be performed, in some embodiments, by a device or system, such as memory device 100 of FIG. 1, memory device 200 of FIG. 2, memory device 400 of FIG. 4, a memory system 700 of FIG. 7, and/or an electronic system 800 of FIG. 8, or another device or system. Although illustrated as discrete blocks, various blocks may be divided into additional blocks, combined into fewer blocks, or eliminated, depending on the desired implementation.

Method 600 may begin at block 602, wherein a first number of fuses of a fuse array may be read, and method 600 may proceed to block 604. For example, the first number of (e.g., 16) fuses may be read (e.g., via fuse read and address counter logic 404 of FIG. 4) from fuse array 402 of FIG. 4.

At block 604, data read from the first number of fuses may be transmitted to a first local latch set of a number of local latch sets, and method 600 may proceed to block 606. For example, the data read from the first number of fuses may be transmitted to the first local latch set (e.g., of latches 245 of FIG. 2) via fuse broadcast logic 410 of FIG. 4.

At block 606, a repair enable state associated with the first set of fuses may be determined. For example, the repair enable state associated with the first set of fuses may be determined via logic 408 of FIG. 4. More specifically, logic 408, which may include XOR compare logic, may receive the data read from the first set of fuses and determine the repair enable state (e.g., an XOR Enable state) of the first set of fuses (e.g., based on an Enable bit and an XOR address bit).

If the repair enable state associated with the first set of fuses is a first state (e.g., a logic 0), method 600 may proceed to block 608. Otherwise, if the repair enable state associated with the first set of fuses is a second state (e.g., a logic 1), method 600 may proceed to block 614.

At block 608, a second number of fuses of the fuse array may be read, and method 600 may proceed to block 610. For example, the second number of (e.g., 16) fuses may be read (e.g., via fuse read and address counter logic 404 of FIG. 4) from fuse array 402 of FIG. 4.

At block 610, data read from the second number of fuses may be transmitted to the first local latch set, and method 600 may proceed to block 612. For example, the data read from the second number of fuses may be transmitted to the first local latch set via fuse broadcast logic 410 of FIG. 4.

At block 614, a second number of fuses of the fuse array may be read, and method 600 may proceed to block 612. For example, the second number of (e.g., 16) fuses may be read (e.g., via fuse read and address counter logic 404 of FIG. 4) from fuse array 402 of FIG. 4. At block 612, a fuse broadcast token may be incremented, and according to some embodiments, method 600 may return to block 602. For example, the acts of method 600 may be repeated for a number of (e.g., 128) fuse sets of a memory device.

Modifications, additions, or omissions may be made to method 600 without departing from the scope of the present disclosure. For example, the operations of method 600 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

Figure 7:
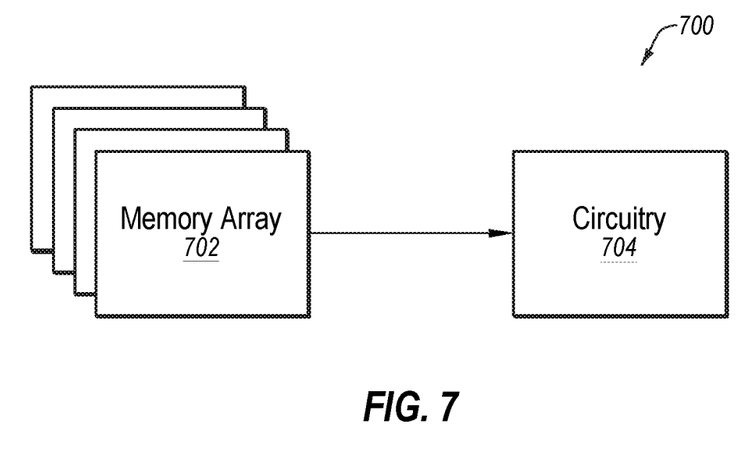
FIG. 7 is a simplified block diagram of an example memory system, in accordance with various embodiments of the present disclosure.

A memory system is also disclosed. According to various embodiments, the memory system may include a memory device (e.g., memory device 100 of FIG. 1) including one or more memory cell arrays. FIG. 7 is a simplified block diagram of a memory system 700 implemented according to one or more embodiments described herein. Memory system 700, which may include, for example, a semiconductor device, includes a memory array 702 and circuitry 704, which may include, for example only, one or more circuits and/or elements illustrated in FIG. 2 and/or FIG. 4, as described herein. Memory array 702, which may include a number of memory banks, may include a number of memory cells. Circuitry 704, which may be operatively coupled to memory array 702, may be configured for carrying out one or more embodiments disclosed herein. Memory system 700 may also include a controller (not shown in FIG. 7) coupled to memory array 702 and/or circuitry 704.

An electronic system is also disclosed. According to various embodiments, the electronic system may include a memory device including a number of memory dies, each memory die having an array of memory cells. Each memory cell may include an access transistor and a storage element operably coupled with the access transistor.

Figure 8:
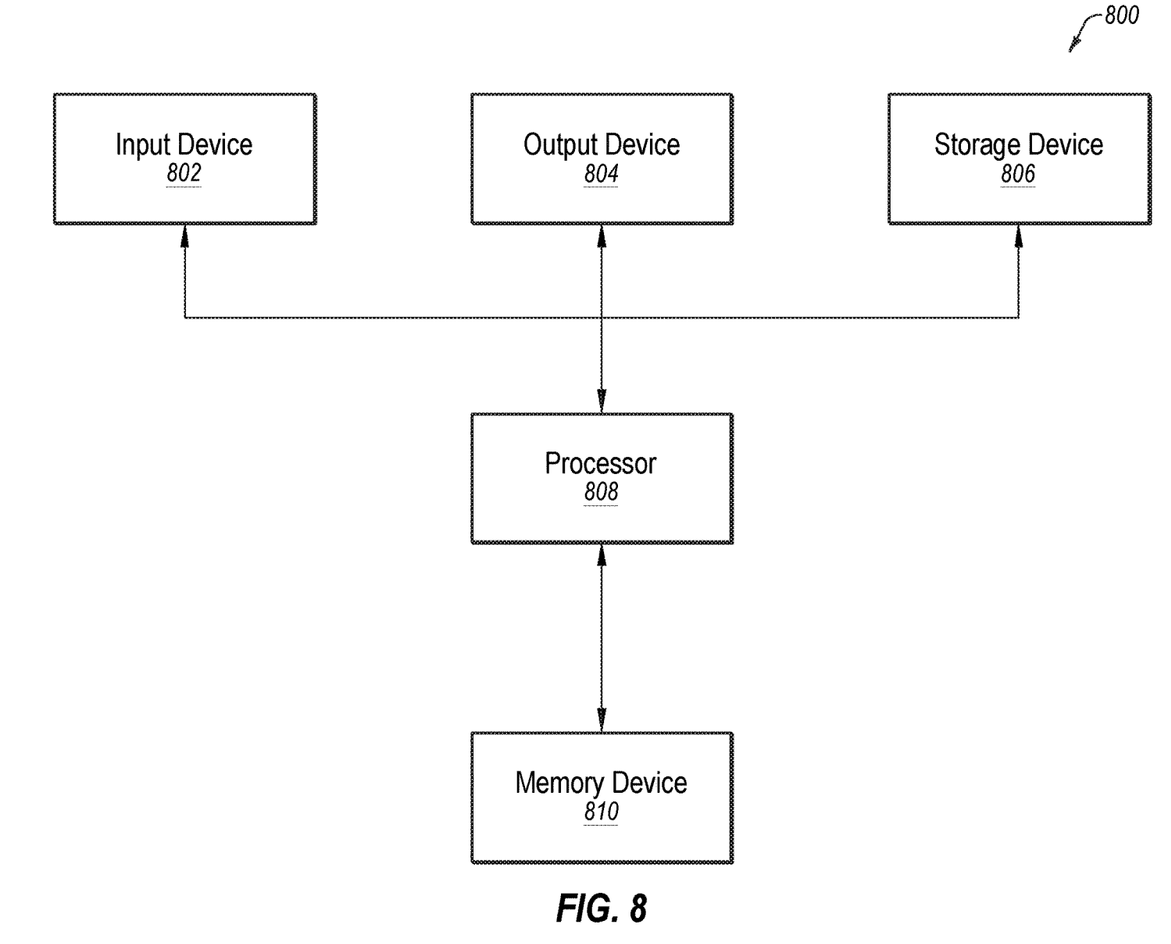
FIG. 8 is a simplified block diagram of an example electronic system, in accordance with various embodiments of the present disclosure.

FIG. 8 is a simplified block diagram of an electronic system 800 implemented according to one or more embodiments described herein. Electronic system 800 includes at least one input device 802, which may include, for example, a keyboard, a mouse, or a touch screen. Electronic system 800 further includes at least one output device 804, such as a monitor, a touch screen, or a speaker. Input device 802 and output device 804 are not necessarily separable from one another. Electronic system 800 further includes a storage device 806. Input device 802, output device 804, and storage device 806 may be coupled to a processor 808. Electronic system 800 further includes a memory device 810 coupled to processor 808. Memory device 810 may include memory system 700 of FIG. 7. Electronic system 800 may include, for example, a computing, processing, industrial, or consumer product. For example, without limitation, electronic system 800 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

As described herein, various embodiments may provide for selectable broadcast of a number of fuse sets to a local latch set. More specifically, various embodiments may include toggling a fuse clock and driving broadcast lines on a first fuse read, but not incrementing a fuse token after the broadcast. As will be appreciated, the fuse clock is a signal that is routed along with broadcast lines that controls the latching of the local latches. The fuse clock may toggle shortly after every new fuse set broadcast to properly latch the data in the local latches.

Further, on a subsequent fuse read, an XOR enable state of the first fuse read may be used to determine whether or not the second fuse read should be broadcast. If the second fuse read is not broadcasted, the fuse clock may not toggle, the fuse token is incremented, and the broadcast lines may be set to a floating state (Hi-Z) or the first fuse read may continue to be broadcast. However, if the second fuse read is broadcast, the broadcast lines and the fuse clock may toggle, and the fuse token may be incremented. Accordingly, as will be appreciated, various embodiments provide for at least two potential fuse sets for each local latch set. According to some embodiments, a fuse set may be selected for broadcast (e.g., during manufacturing) based on defective fuse blow and/or a canceled column repair.

As noted above, in some conventional column repair schemes (e.g., conventional column repair and encoded column segmentation repair), a canceled column repair consumes two column repairs (i.e., the original column repair fuse set and a latch local set (i.e., used to fix the main array defect) are unusable after being canceled, and a new fuse set and a latch set are required to fix the underlying main array defect). In contrast, by employing various embodiments disclosed herein, a canceled column repair may only require one column repair. In other words, an original column repair fuse set may be unusable after being canceled, however data from a backup fuse set may be broadcast to the same local latch set as the original column repair fuse set (i.e., the local latch set is reused). Thus, various embodiments may save a latch set (e.g., at least in the case of a canceled column repair), which may be used for another repair, if necessary. As will be appreciated, various embodiments may be particularly advantageous in latch-limited repair schemes.

Various embodiments of the present disclosure may include a device. The device may include a number of memory banks and a number of latch sets, wherein each latch set is associated with a memory bank of the number of memory banks. The device may also include a fuse array including a number of fuses. The device may further include circuitry configured to read data from a first set of fuses of the number of fuses. The circuitry may also be configured to broadcast data from the first set of fuses to a first latch set of the number of latch sets. Moreover, in response to a repair result associated with the first set of fuses being a first state, the circuitry may be configured to read a second set of fuses and broadcast the second set of fuses to the first latch set.

According to another embodiment of the present disclosure, a method of operating a memory device may include reading a first number of fuses of a fuse array and transmitting data from the first number of fuses to a first local latch set of a number of local latch sets. Moreover, in response to a repair enable state associated with the first number of fuses being a first state, the method may include reading a second number of fuses of the fuse array and transmitting data from the second number of fuses to the first local latch set.

Additional embodiments of the present disclosure include a system. The system may include at least one input device, at least one output device, and at least one processor device operably coupled to the input device and the output device. The system may also include at least one memory device operably coupled to the at least one processor device and comprising a number of latch sets and a fuse array including a number of fuses. The at least one memory device may further include circuitry configured to read data from a first set of fuses of the fuse array. The circuitry may further be configured to broadcast the data from the first set of fuses to a first latch set of the number of latch sets. Moreover, in response to a repair state associated with the first set of fuses being a first state, the circuitry may be configured to read a second set of fuses and broadcast data from the second set of fuses to the first latch set.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

As used herein, the term "semiconductor" should be broadly construed, unless otherwise specified, to include microelectronic and MEMS devices that may or may not employ semiconductor functions for operation (e.g., magnetic memory, optical devices, etc.).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A device, comprising:
   a number of memory banks;
   a number of latch sets, wherein each latch set of the number of latch sets is associated with a memory bank of the number of memory banks;
   a fuse array including a number of fuses; and
   circuitry configured to:
   read a first set of fuses of the number of fuses;
   broadcast data from the first set of fuses to a first latch set of the number of latch sets; and
   in response to a repair result associated with the first set of fuses being a first state:
   read a second set of fuses of the number of fuses; and
   broadcast data from the second set of fuses to the first latch set.

2. The device of claim 1, wherein the first state indicates that a repair associated with the first set of fuses was not used or was canceled.

3. The device of claim 1, wherein the circuitry is further configured to, in response to the repair result being the first state, increment a fuse broadcast token after the data from the second set of fuses is broadcast.

4. The device of claim 3, wherein the circuitry is further configured to:
   read from a third set of fuses of the number of fuses;
   broadcast data from the third set of fuses to a second latch set of the number of latch sets; and
   in response to a repair result associated with the third set of fuses being the first state:
   read a fourth set of fuses of the number of fuses;
   broadcast data from the fourth set of fuses to the second latch set; and
   increment the fuse broadcast token.

5. The device of claim 1, wherein the circuitry is further configured to, in response to the repair result being a second state:
   read from the second set of fuses of the number of fuses;
   increment a fuse broadcast token; and
   read from a third set of fuses of the number of fuses.

6. The device of claim 5, wherein the second state indicates that the first set of fuses is associated with an enabled repair.

7. The device of claim 5, wherein the circuitry is further configured to:
   broadcast data from the third set of fuses to a second latch set of the number of latch sets; and
   in response to a repair result associated with the third set of fuses being a first state:
   read a fourth set of fuses of the number of fuses; and broadcast data from the fourth set of fuses to the second latch set.

8. The device of claim 1, wherein the first state indicates that the first set of fuses is associated with canceled column repair.

9. The device of claim 1, wherein the repair result is determined via an XOR state of the first set of fuses, via a decoded state of the first set of fuses, or a combination thereof.

10. A method, comprising:
reading a first number of fuses of a fuse array;
transmitting data from the first number of fuses to a first local latch set of a number of local latch sets; and
in response to a repair enable state associated with the first number of fuses being a first state:
reading a second number of fuses of the fuse array; and
transmitting data from the second number of fuses to the first local latch set.

11. The method of claim 10, further comprising, in response to the repair enable state being a second state:
reading the second number of fuses of the fuse array; and
incrementing a fuse broadcast token.

12. The method of claim 11, further comprising:
reading a third number of fuses of the fuse array; and
broadcasting data from the third number of fuses to a second latch set of the number of local latch sets.

13. The method of claim 10, wherein determining the repair enable state comprises one of:
determining that the first number of fuses are not associated with a repair or that the first number of fuses is associated with a canceled repair; or
determining that the first number of fuses are associated with a repair.

14. The method of claim 10, further comprising, in response to the repair enable state being the first state, incrementing a fuse broadcast token after transmitting data from the second number of fuses to the first local latch set.

15. The method of claim 14, further comprising:
reading a third number of fuses of the fuse array;
transmitting data from the third number of fuses to a second local latch set of the number of local latch sets; and
in response to a repair enable state associated with the third number of fuses being the first state:
reading a fourth number of fuses of the fuse array; and
broadcasting data from the fourth number of fuses to the second local latch set.

16. The method of claim 10, further comprising, in response to the repair enable state being a second state indicating that the first number of fuses is associated with a repair:

reading a third number of fuses of the fuse array;
incrementing a fuse broadcast token; and
reading a fourth number of fuses of the fuse array.

17. The method of claim 16, further comprising:
transmitting data from the fourth number of fuses to a second local latch set of the number of local latch sets; and
in response to a repair enable state associated with the fourth number of fuses being the first state:
reading a fifth number of fuses of the fuse array; and
transmitting data from the fifth number of fuses to the second local latch set.

18. A system, comprising:
at least one input device;
at least one output device;
at least one processor device operably coupled to the at least one input device and the at least one output device; and
at least one memory device operably coupled to the at least one processor device and comprising:
a number of latch sets;
a fuse array; and
circuitry configured to:
read data from a first set of fuses of the fuse array;
broadcast the data from the first set of fuses to a first latch set of the number of latch sets; and
in response to a repair state associated with the first set of fuses being a first state:
read data from a second set of fuses; and
broadcast the data from the second set of fuses to the first latch set.

19. The system of claim 18, wherein the circuitry comprises:
fuse read circuitry configured to read the data from the first set of fuses and the data from the second set of fuses;
data compare logic coupled to the fuse read circuitry and configured to:
determine the repair state associated with the first set of fuses; and
assert a broadcast enable signal responsive to the repair state being the first state; and
fuse broadcast logic coupled to the data compare logic and configured to broadcast the data from the second set of fuses to the first latch set responsive to the asserted broadcast enable signal.

20. The system of claim 18, wherein the repair state associated with the first set of fuses is based on either an Enable bit and an XOR address bit associated with the first set of fuses or a decoded state of the first set of fuses.

* * * * *

UNITED STATES PATENT AND TRADEMARK OFFICE
CERTIFICATE OF CORRECTION

PATENT NO. : 11,244,741 B1
APPLICATION NO. : 17/089002
DATED : February 8, 2022
INVENTOR(S) : Christopher G. Wieduwilt, James S. Rehmeyer and Seth A. Eichmeyer It is certified that error appears in the above-identified patent and that said Letters Patent is hereby corrected as shown below:

In the Specification
Column 3, Line 32, change "BL and/BL" to --BL and /BL--
Column 3, Line 34, change "BL and/BL" to --BL and /BL--
Column 3, Line 36, change "BL and/BL" to --BL and /BL--
Column 3, Line 42, change "BL and/BL" to --BL and /BL--
Column 3, Line 43, change "BL and/BL" to --BL or /BL--
Column 3, Line 52, change "BL and/BL" to --BL or /BL--

Signed and Sealed this
Twenty-second Day of March, 2022

Drew Hirshfeld
*Performing the Functions and Duties of the*
*Under Secretary of Commerce for Intellectual Property and*
*Director of the United States Patent and Trademark Office*